(12) United States Patent
Stradins et al.

(10) Patent No.: US 8,569,708 B2
(45) Date of Patent: Oct. 29, 2013

(54) HIGH SENSITIVITY, SOLID STATE NEUTRON DETECTOR

(75) Inventors: Pauls Stradins, Golden, CO (US); Howard M. Branz, Boulder, CO (US); Qi Wang, Littleton, CO (US); Harold R. McHugh, Santa Ynez, CA (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 81 days.

(21) Appl. No.: 13/146,780

(22) PCT Filed: Jan. 30, 2009

(86) PCT No.: PCT/US2009/032557
§ 371 (c)(1),
(2), (4) Date: Jul. 28, 2011

(87) PCT Pub. No.: WO2010/087844
PCT Pub. Date: Aug. 5, 2010

(65) Prior Publication Data
US 2011/0284755 A1    Nov. 24, 2011

(51) Int. Cl.
*G01T 3/08* (2006.01)
(52) U.S. Cl.
USPC .................................... 250/370.05
(58) Field of Classification Search
USPC .................................... 250/370.05
See application file for complete search history.

(56) References Cited

U.S. PATENT DOCUMENTS

| | | |
|---|---|---|
| 4,419,578 A | 12/1983 | Kress |
| 4,785,186 A | 11/1988 | Street et al. |
| 5,002,720 A | 3/1991 | Berggren |
| 5,281,822 A | 1/1994 | Albrecht et al. |
| 5,399,863 A | 3/1995 | Carron et al. |
| 5,726,453 A * | 3/1998 | Lott et al. ................. 250/390.01 |
| 5,940,460 A | 8/1999 | Seidel et al. |
| 6,545,281 B1 | 4/2003 | McGregor et al. |

(Continued)

FOREIGN PATENT DOCUMENTS

WO    2005088719    9/2005

OTHER PUBLICATIONS

PCT International Search Report and Written Opinion dated Mar. 29, 2010, application No. PCT/US2009/032557.

(Continued)

*Primary Examiner* — Christine Sung
(74) *Attorney, Agent, or Firm* — Paul J. White; J. Patrick Kendrick

(57) ABSTRACT

An apparatus (200) for detecting slow or thermal neutrons (160) including an alpha particle-detecting layer (240) that is a hydrogenated amorphous silicon p-i-n diode structure. The apparatus includes a bottom metal contact (220) and a top metal contact (250) with the diode structure (240) positioned between the two contacts (220, 250) to facilitate detection of alpha particles (170). The apparatus (200) includes a neutron conversion layer (230) formed of a material containing boron-10 isotopes. The top contact (250) is pixilated with each contact pixel extending to or proximate to an edge of the apparatus to facilitate electrical contacting. The contact pixels have elongated bodies to allow them to extend across the apparatus surface (242) with each pixel having a small surface area to match capacitance based upon a current spike detecting circuit or amplifier connected to each pixel. The neutron conversion layer (860) may be deposited on the contact pixels (830) such as with use of inkjet printing of nanoparticle ink.

9 Claims, 9 Drawing Sheets

(56) References Cited

U.S. PATENT DOCUMENTS

| | | |
|---|---|---|
| 6,727,504 B1 | 4/2004 | Doty |
| 6,771,730 B1 | 8/2004 | Dowben et al. |
| 7,372,009 B1 | 5/2008 | Losee et al. |
| 7,518,119 B2 * | 4/2009 | Friedman et al. ............. 250/374 |
| 2002/0130335 A1 | 9/2002 | Inbe |
| 2003/0178574 A1 | 9/2003 | Wallace et al. |
| 2005/0082489 A1 * | 4/2005 | August et al. ............ 250/370.05 |
| 2005/0224719 A1 | 10/2005 | Polichar et al. |
| 2005/0258372 A1 * | 11/2005 | McGregor et al. ....... 250/390.01 |
| 2006/0252852 A1 * | 11/2006 | Braun et al. .................. 523/200 |
| 2008/0017804 A1 * | 1/2008 | Krishnamoorthy et al. ....................... 250/370.05 |
| 2008/0128628 A1 | 6/2008 | Moses et al. |
| 2011/0127527 A1 * | 6/2011 | Kub et al. ....................... 257/43 |

OTHER PUBLICATIONS

Voytchev, M. et al., "Neutron Detection With a Silicon PIN Photodiode and LiF Converter", Nuclear Instruments and Methods in Physics Research, A, 512 (2003) pp. 546-552.

Mireshghi, A. et al., "High Efficiency Neutron Sensitive Amorphous Silicon Pixel Detectors", IEEE Transactions on Nuclear Science, vol. 41, No. 4, Aug. 1994.

McHugh, H., "Laminated Amorphous Silicon Neutron Detector,", 2009.

* cited by examiner

HIGH SENSITIVITY, SOLID STATE NEUTRON DETECTOR

CONTRACTUAL ORIGIN

The United States Government has rights in this invention under Contract No. DE-AC36-08G028308 between the United States Department of Energy and the Alliance for Sustainable Energy, LLC, the manager and operator of the National Renewable Energy Laboratory.

BACKGROUND

Neutron detection is used for a variety of purposes. For example, neutron detectors are used to enhance safety in nuclear power facilities because neutron radiation can be a safety hazard with use of nuclear reactors. With the development of nuclear weapons, there has been an increasing need for high sensitivity neutron detectors to safeguard nuclear materials and weapons, to verify treaty and regulations compliance, and to recover military payloads. Significantly, neutron detectors are needed to minimize the risk of nuclear weapons proliferation. Many are concerned that weapons grade plutonium or other radioactive materials may be stolen and transferred across country borders for use by terrorists or warring factions or countries. Neutron detectors may be used at ports of entry such as harbors, border crossings, and airports to detect the presence of radioactive materials such as plutonium that release neutrons as neutrons cannot be easily hidden with shielding. Such neutron surveillance must be accomplished without undue restriction or disruption of traffic flow and events.

Unfortunately, neutron detection is not an easy science, and developers of neutron detectors face a number of difficult challenges. A naturally occurring neutron fluence is always present, and this fluence varies with the molecular composition of adjacent soil, water, buildings, and so on as well as with latitude and elevation. The time variance of the background fluence has been described as having a Poisson distribution with respect to time. Thus, the extraction of meaningful data has to rely on obtaining sufficient data to make statistically meaningful conclusions. Typically, when searching for contraband neutron sources, the neutron flux emission is very low and not readily separated from the background signature; thus, large detectors can collect data more rapidly than smaller ones. Another challenge in designing a neutron detector is that neutrons are electrically neutral, do not respond to electric fields, and are weakly interacting with electrons. Hence, neutrons do not ionize atoms except by direct collision with nuclei of few selected element isotopes, which makes conventional gaseous ionization detectors ineffective in neutron detection.

Presently, costly and bulky pressurized tubes using rare Helium-3 gas are used to detect neutrons. These conventional neutron detectors are considered to be within a class of conventional neutron detectors labeled gas-filled counters that require the application of high voltage and gamma rejection circuitry. In practice, the Helium-3 filled tubes also require careful handling since they can indicate false positives when abruptly moved or struck (e.g., provide an undesirable microphonic response). These types of conventional neutron detectors are effective in many types of field operations, but they are not suitable for operations requiring compact (e.g., covert) and highly sensitive devices capable of functioning for long periods of time with low power consumption. In addition, these types of detectors are typically hand-fabricated and use Helium-3 gas that is generated in a nuclear reactor, making them expensive to manufacture in any quantity. The high cost of these devices has severely limited their deployment in areas such as border crossings, cargo container inspection equipment, and the like where they could be used to detect movement of contraband such as plutonium or plutonium-based weapons.

In some attempts to create an improved neutron detector, some researchers have used solid-state electronics to sense alpha particles emitted from a neutron converter material in which a reaction has taken place in which a neutron has collided and generated one or more alpha particles. The role of the converter material is to convert incident neutrons into emitted charged particles, which are more readily sensed. When the emitted charged particle transits a semiconductor device, it liberates bound charges in its wake, and these charges may be collected and used to sense the event stimulated by the initial neutron reaction. Such devices therefore serve as neutron detectors including converter material and a semiconductor-based detector. For example, a boron-10 and lithium-6 metal, e.g., a neutron detection layer, has been applied directly to a crystalline device (such as a gallium arsenide crystalline PIN diode) to provide a neutron detector. However, the use of crystalline diode structures in neutron detectors has its own set of drawbacks and limitations. The internal noise level of an uncooled crystalline diode is appreciable, and consequently researchers have found it difficult to measure low background levels of ambient thermal neutrons in the surrounding area or to detect single neutron events using diodes of any consequential size. A typical crystalline diode also has a thick semiconductor layer in which charges are collected, and it can be expensive and difficult to grow large crystalline detectors. Charges liberated by gamma rays are also collected in the thick semiconductor layer, and these charges contribute to the non-neutron noise signal of the detector. It is imperative that gammas not be mistaken for neutrons since in a typical environment the background gamma fluence greatly exceeds the neutron fluence expected from a typical source of neutrons.

The drawbacks associated with such solid-state neutron detectors including high cost, small size, and difficulty to manufacture have resulted in continued use of the bulky and expensive Helium-3 pressurized tube devices to detect neutrons. There remains a need for a high sensitivity neutron detector that can be more easily manufactured, that is less expensive (e.g., allowing neutron detectors to be more widely implemented and used), and that can be readily scaled in size (e.g., monitor a larger surface area to support detection of radioactive materials such as smuggled plutonium and plutonium-based weapons hidden in moving objects such as objects on conveyor belts and the like).

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

Briefly, neutron detectors are described that are all thin-film. For example, a neutron detector is presented that includes a thin film of boron-10 containing materials such as may be deposited using thin-film deposition techniques such as sputtering or evaporation or by spraying, inkjet printing, or the like an ink that may include boron-10 (or lithium-6) or nano- or microparticles of boron-10 (or lithium-6) containing materials (such as boron-10 carbide, nitride, boron, or the like). The neutron detector further may include a thin-film detecting layer that detects alpha particles emitted from the neutron conversion layer, and some embodiments utilize an amorphous silicon-based p-i-n diode structure with a bottom and top contact layer. In some cases, the top contact is a pixilated layer of metal such as palladium, with each of the pixels being relatively long, thin strips such that they can extend to the edge of the detector for contacting while providing limited capacitance to facilitate single neutron event detection by observing the current spike produced in the amorphous silicon diode by a connected amplifier or the like. For example, some detectors may include rectangular pixels arranged in a parallel manner on the detector and with surface areas of less than about 1 $cm^2$ and more typically of less than about 0.5 $cm^2$ to limit capacitance.

The neutron conversion layer may relatively thin, such as less than about 5 microns and more than about 1 micron and typically about 2 microns, to facilitate passing of alpha particles with detectable energy to the detecting layer. This may provide only limited efficiency of neutron detection (e.g., about 3 percent or less). Some neutron detection devices may increase this efficiency or device sensitivity by providing additional neutron conversion layers (e.g., sandwich the detecting layer between two conversion layers) or provide two to ten or more neutron detectors stacked on top of each other. In this manner, detection devices can readily be provided with sensitivities in the 10 to 50 percent range. The detection devices may also be used in neutron imaging applications such as where the pixel size could be reduced according to spatial resolution requirements and the resultant read out in a video frame format (as one non-limiting example).

More particularly, an apparatus is provided for detecting slow or thermal neutrons. The apparatus includes an alpha particle-detecting layer that is formed of a thin film of silicon material. In some embodiments, the detecting layer is a hydrogenated amorphous silicon p-i-n diode structure, and the apparatus includes a bottom metal contact and a top metal contact with the diode structure positioned between the two contacts to facilitate detection of charged particles transiting the layer. In other embodiments, the detecting layer may be an n-i-p amorphous silicon diode structure. The amorphous silicon detector may flow a very low reverse current under applied reverse bias such as 2 to 20 volts, so that the current produced by the alpha particle transit is easily detected over the reverse current of the diode. The apparatus further includes a neutron conversion layer including material with or enriched with boron-10 isotopes, which emit alpha particles that strike the detecting layer when neutrons are received by or strike the neutron conversion layer. The top contact may be a pixilated metal layer with each contact pixel extending to or proximate to an edge of the apparatus (e.g., an edge of a supporting layer or substrate) to facilitate electrical connections/contacting. The contact pixels may have elongated bodies to allow them to extend across the apparatus surface and each body of a pixel may have a surface area of less than about 10 $cm^2$ and more than about 0.5 $cm^2$. In some embodiments, the neutron conversion layer is deposited on top of these contact pixels of the top contact, which results in the conversion layer also including a plurality of pixels. In other cases, the neutron conversion layer is electrically insulating so it can be deposited on top of the pixels as a single layer without a plurality of pixels. In other cases, the plurality of metal contacts to the amorphous silicon detector may be deposited before the amorphous silicon and the top contact may be a single metal layer. In other cases, the apparatus may include a substrate and the neutron conversion layer may be positioned between the substrate and the detecting layer. In other cases, the apparatus may include two neutron conversion layers and the detecting layer may be sandwiched between these two boron-10 containing layers, which may have a thickness of less than about 2 microns (e.g., 1 to 1.5 microns or the like) to better assure alpha particles are delivered to the detecting layer. This concept can be extended to include a continuous process whereby layer upon layer of boron and p-i-n or n-i-p diodes can be deposited to form a multilayer sandwiched detector in a continuous or repeated manufacturing process.

In some cases, a neutron detecting device is provided with the neutron converting layer deposited on a thin substrate and the amorphous silicon PIN or NIP diode detecting layer deposited on a separate substrate. In such an embodiment, the deposited neutron conversion layers and PIN or NIP diode detecting layers may be oriented such that they are facing each other in abutting contact or separated by a thin gap of air or other material through which the alpha particles generated by neutrons can easily travel to the PIN or NIP diode detecting layer.

In addition to the exemplary aspects and embodiments described above, further aspects and embodiments will become apparent by reference to the drawings and by study of the following descriptions.

BRIEF DESCRIPTION OF THE DETAILED DRAWINGS

Figure 9:
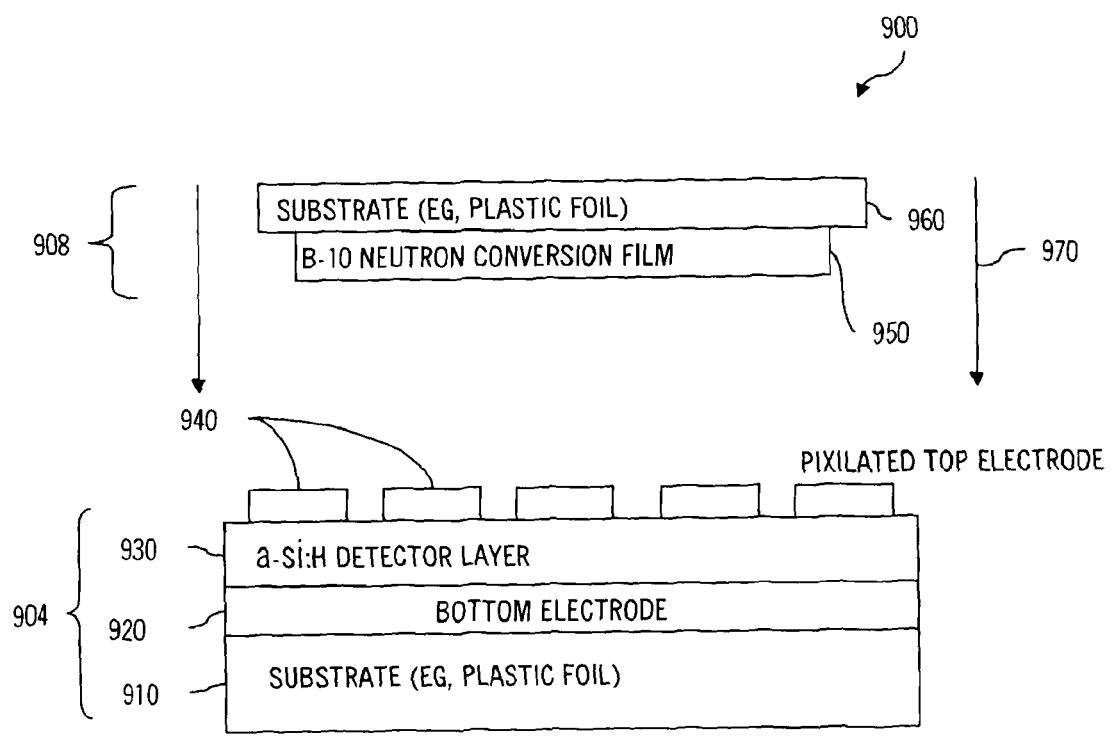

FIGS. 8A-8D illustrate sectional views of a thin film neutron detector during several manufacturing or fabrication processes resulting in the application of a neutron conversion layer (pixilated in this example) over pixilated top contacts; and FIG. 9 illustrates fabrication of a neutron detector with separate fabrication of the PIN diode/detector and of the neutron conversion layer/film and later assembly of these components or assemblies to produce a neutron detector.

DESCRIPTION

Briefly, the following description is directed to enhanced neutron detectors and methods of manufacturing high sensitivity neutron detectors. The inventors recognized that neutron detectors could be produced using thin film manufacturing techniques to provide thin films to provide both the neutron conversion layer and the detecting layer. The neutron conversion layer can be fabricated according to the teaching herein to control cracking and peeling of this layer, which includes the isotope boron-10 (B-10 or $^{10}$B) or any isotope with a high cross section for thermal neutrons including but not limited to lithium-6 and the like. The detecting layer is formed in some embodiments a silicon-based thin film PIN or NIP diode structure/detector, and, in some cases, the thin film includes amorphous silicon (i.e., a-Si:H). The detector could also be of a-SiC:H or nanocrystalline silicon or another wide bandgap thin film semiconductor material. To facilitate sensitive detection of current spikes in the detecting layer, embodiments of the neutron detector include a pixilated top electrode or contact (e.g., a plurality of smaller top contacts and, it should be remembered that pixilation may also be at the bottom electrode or contact) near the detecting layer rather than a single large top contact layer as typically found in solid-state devices. Further, the pixilation size and shape was chosen in some cases to control capacitance (e.g., match capacitance requirements to a connected detection device such as a preamplifier circuit/chip) and also to position an edge of each top contact pixel or pixilated contact near or at the edge of the detector (or a supporting substrate) to facilitate electrical connection (e.g., wiring to an amplifier and/or connection to a ribbon connector). Efficiencies may be increased in some embodiments of neutron detection devices by providing multiple layers or a stack of individual neutron detectors. For example, a single layer neutron detector may have an efficiency of about 3 percent or less, but a neutron detection device with an assembly or stack of two or more neutron detectors may be able to increase the efficiency of the detection device to 10 to 30 percent by including four to ten or more thin film neutron detectors.

Figure 1:
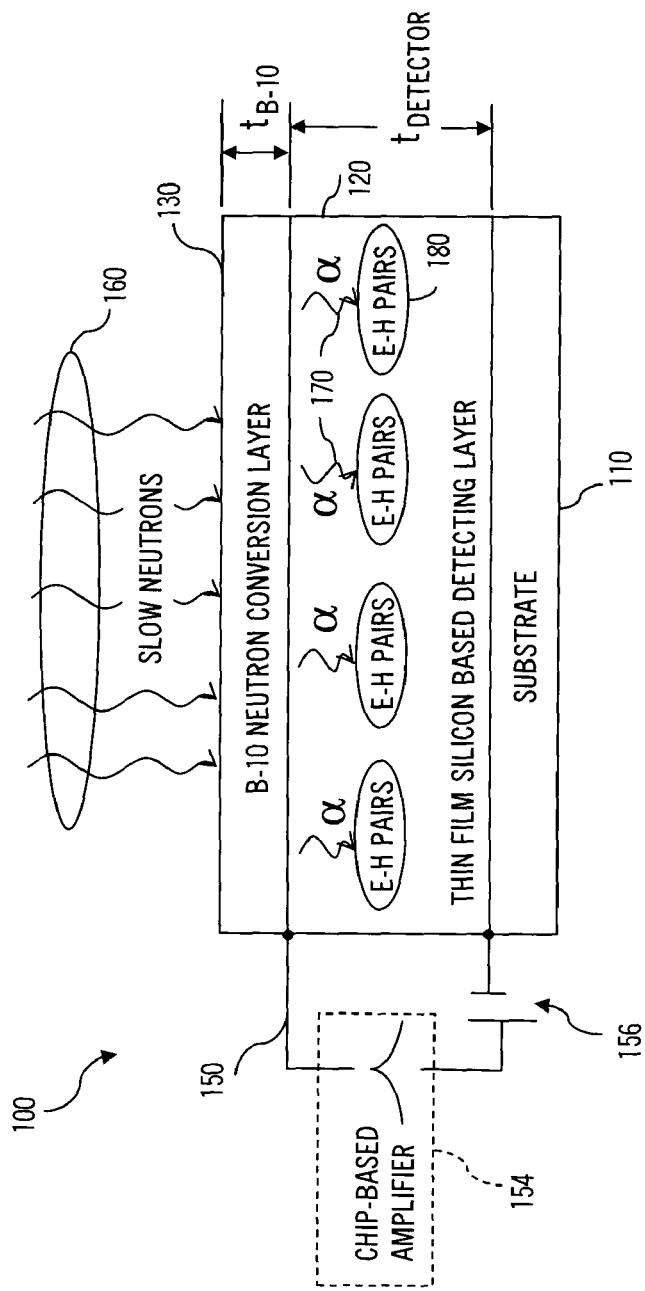
FIG. 1 is a schematic view of a neutron detector or neutron detection device showing use of a neutron conversion layer (e.g., a thin layer of material including B-10) in combination with a thin film detecting layer (e.g., amorphous silicon or the like useful for detecting alpha particles emitted from the neutron conversion layer)

FIG. 1 illustrates schematically a thin film neutron detection device 100 that may be used to provide high sensitivity detection of neutrons (e.g., presence of plutonium or other radioactive material emitting thermal neutrons). The detection device 100 includes a substrate 110 such as a thin layer of plastic, glass, ceramic, metal, or the like. A thin film silicon-based detecting layer 120 is formed or provided upon the substrate 110. In some embodiments, the layer 120 takes the form of an a-Si:H p-i-n (or PIN) or n-i-p (NIP) diode structure with a thickness, $t_{detector}$, of less than about 30 microns and more typically less than about 10 microns. The detection device 100 further includes a B-10 neutron conversion layer (or thin film) 130, which may be a layer with a thickness, $t_{B-10\ layer}$, of less than about 5 microns, more typically less than about 4 microns, and even more typically less than about 2 microns. The B-10 neutron conversion layer 130 may be boron, boron carbide ($B_4C$), boron nitride ($B_3N_3$), nano- or micro-particles containing B-10 or other materials in an organic filler material, or the like enriched with or including the isotope boron-10. A chip-based amplifier or detection amp 154 is electrically connected to the device 100 by leads 150, and a power source or battery 156 may be included to provide reverse bias to the pin diode and enhance detection, and the leads 150 typically would be connected to a bottom contact layer or electrode (not shown in FIG. 1) and to pixilated top contacts or electrodes (not shown in FIG. 1 but described in detail at least with reference to FIGS. 2 and 3). The detection amplifier could be included as a thin film device deposited on the same substrate as the p-i-n or n-i-p sensing diode.

In operation, neutrons 160 (e.g., slow or thermal neutrons) strike the neutron conversion layer 130. In response, the B-10 particles or component of the layer 130 emit alpha particles that are transmitted through portions of the conversion layer 130 and into the detecting layer 120. The alpha particles 170 are detected in the detecting layer 120 via electron-hole pairs 180 and the chip-based amplifier 154, which senses pulses or current spikes associated with each or nearly each alpha particle 170 that is transmitted into the detecting layer 120.

Figure 2:
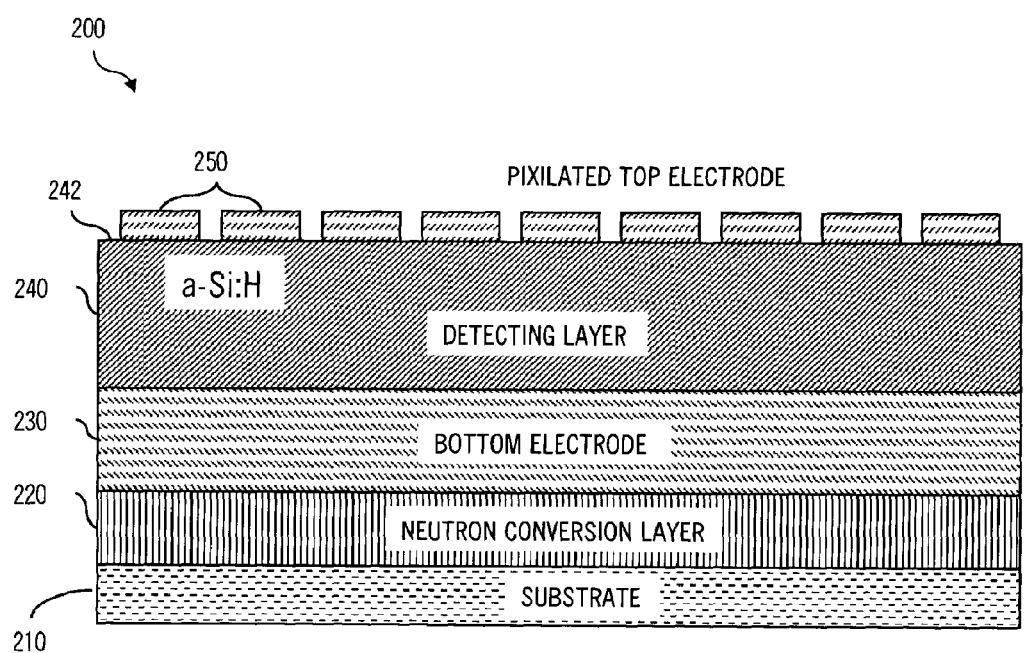
FIG. 2 is a sectional view of an embodiment of a neutron detector showing use of pixilated top electrodes or contacts along with an amorphous silicon thin film as the detecting layer.

FIG. 2 illustrates a sectional view of one embodiment of a neutron detector or detector sheet 200. The detector 200 includes a thin (e.g., less than about 0.5 mm or the like) substrate 210 of glass, plastic, ceramic, metal, or other material useful for thin film substrates. A neutron conversion layer 220 (e.g., B-10 or its compounds such as B-10 carbide, B-10 nitride, and the like) is coated upon the substrate 210, and a metal bottom electrode or contact layer 230 is deposited over all or a portion of the conversion layer 220. A silicon-based detecting layer 240 is coated over the bottom electrode 230, and the layer 240 may comprise amorphous or other thin-film silicon with a thickness in some cases of less than about 10 microns. The layer 240 may be formed to provide an a-Si:H PIN or NIP diode structure. On an upper surface 242 of the detecting layer, a pixilated top electrode 250 is provided for detecting when alpha particles emitted by the neutron conversion layer 220 (in response to thermal neutrons striking the conversion layer 220) transit the detecting layer 240.

In practice, the signals produced by the layer 240 (e.g., by about 100,000 $e^-$-$h^+$ pairs when an alpha particle is stopped in a-Si:H material of layer 240) are transmitted via the contact pixels 250 or pixilated contact 250 to a connected or linked detection circuit/chip (such as an external chip-based amplifier linked to each pixel of contact 250). In some embodiments, the neutron detector 200 may include the layers 220, 230, 240, and 250 on the other side of the substrate, as a detector 200 may include the detection layers on either or both sides of the substrate 210 and also may include two or more of the neutron conversion layers 220 and a like or differing number of the detecting layers 240. Also, the neutron conversion layer 220 may be underneath the detecting layer 240 and bottom electrode 230 as shown in FIG. 2, or be on top of detecting layer 240 and top pixilated contact 250, on both sides of the sequence comprising the detecting layer 240 and its top and bottom contact layers 230, 250. In other cases, the neutron conversion layer 220 may be separated from the substrate 210 with the sequence comprising the detecting layer 240 and its top and bottom contact layers 230, 250 by an air gap (or thin layer of material that allows passage of at least a portion of the alpha particles from the conversion layer 220).

Figure 3:
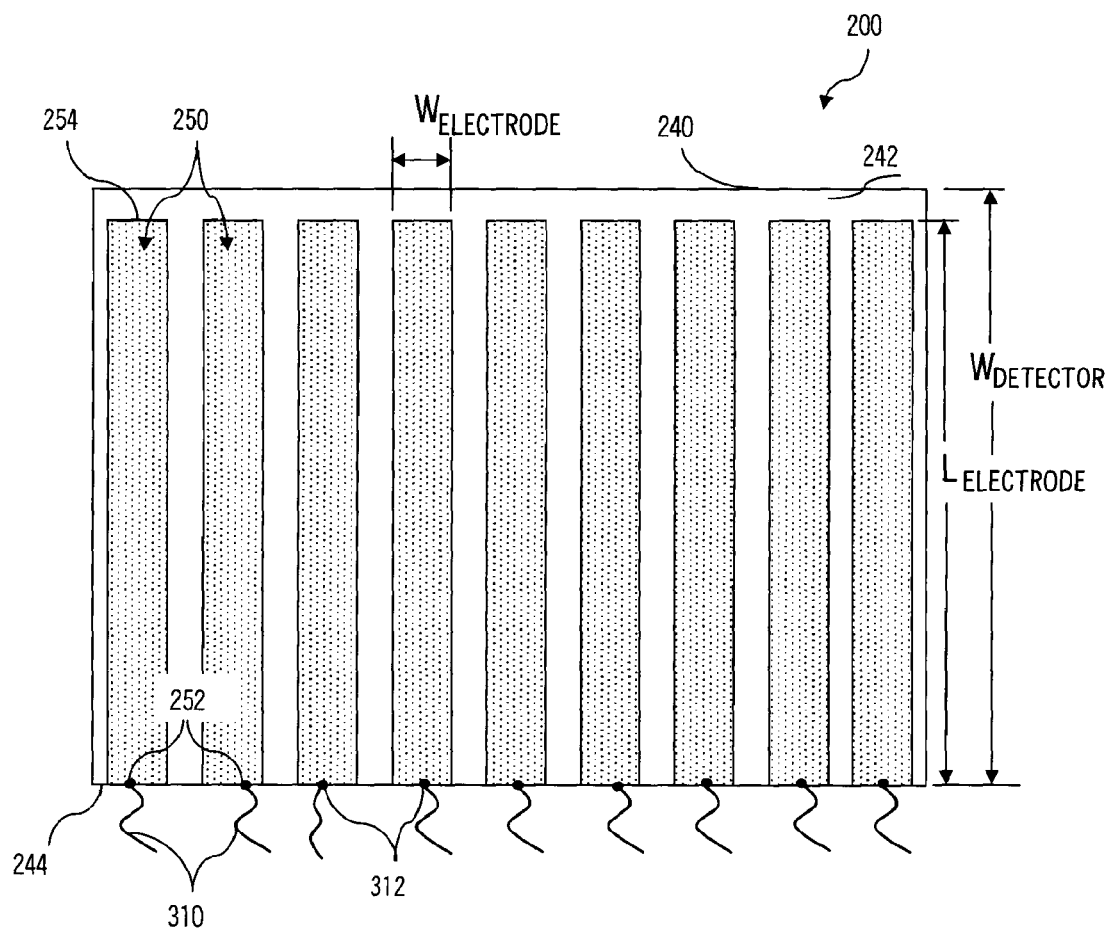
FIG. 3 is a top view of the neutron detector further showing details of the pixilated top electrodes including their elongated or narrow-body design allowing them to extend to the edge or side of the detector (or supporting substrate/layer) to facilitate electrical connection of the detector.
Figure 7:
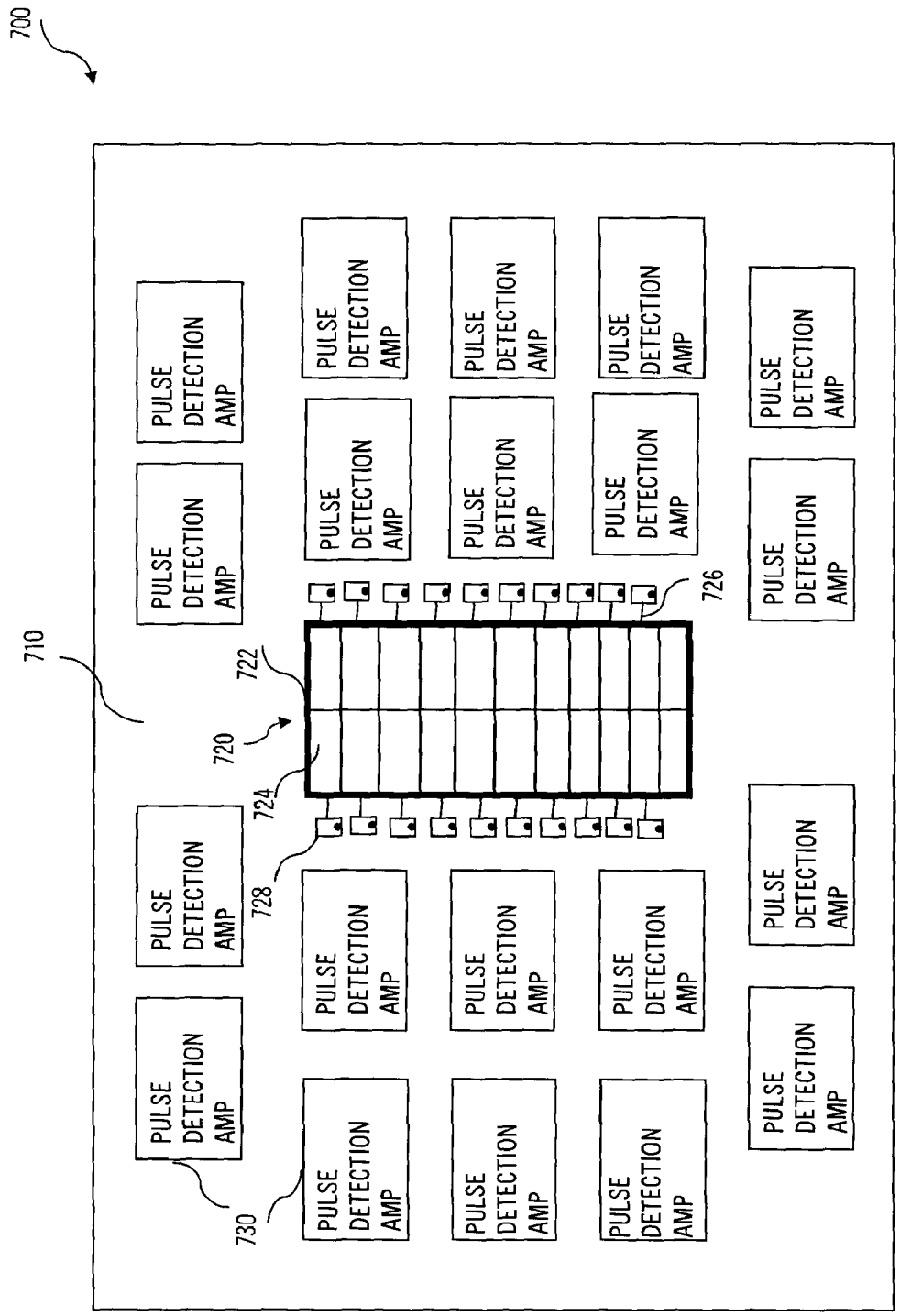
FIG. 7 shows one embodiment of a neutron detection device illustrating the electrical connection of a neutron detector to a number of pulse detection components (e.g., pulse detection amplifier circuits or chip-based detectors) and also illustrating another configuration of pixilated top electrodes or contacts.
Figure 8:
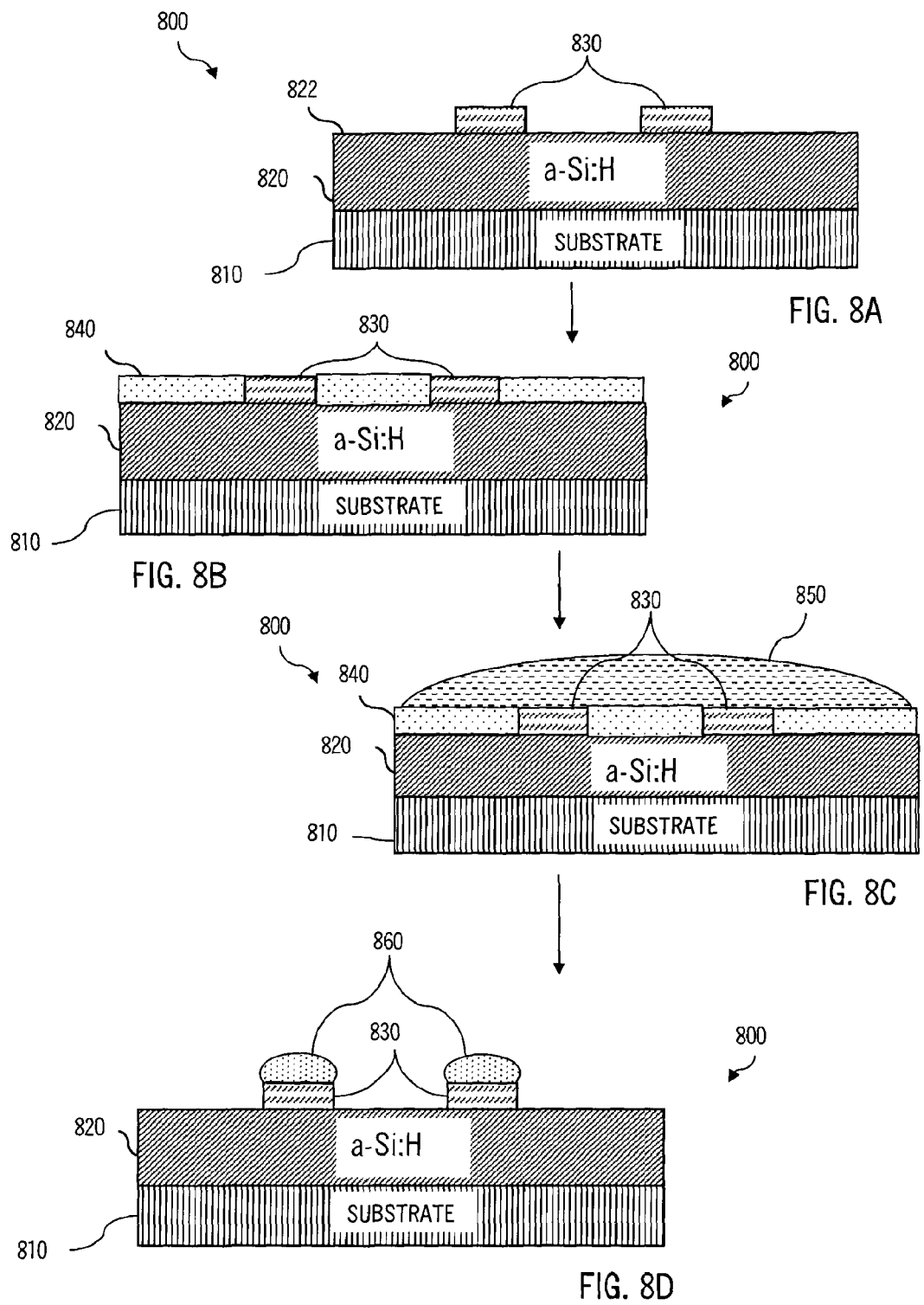

As shown in FIG. 3, the pixilated contact or top electrode 250 is shaped and oriented so as to allow electrical contacting at the edge 244 of the detector element as shown connections 312 to leads 310 (which typically would be attached to an amplifier or similar device with some embodiments providing such an amplifier or device provided for each pixel of contact 250). The neutron detector device 200 includes a pixilated top electrode 250 that includes a plurality of long strips that extend from a first end 252 near the substrate/device edge 244 to a second end 254 at or proximate to the opposite side/edge of the substrate 240. The elongated bodies or strips of electrode 250 may in some cases have length, $L_{electrode}$, of up to a few centimeters while having a width, $W_{electrode}$, that is much smaller such as less than a few millimeters. The electrode pixels are shown to be spaced apart on surface 242 and typically will be substantially parallel (e.g., their longitudinal axes are all substantially parallel). The electrode 250 or its pixels may extend nearly across the detector 200 (e.g., $L_{electrode}$ may be about equal to the width, $W_{detector}$) or it may be a substantial fraction such as at least about 70 percent, but in some cases such as shown in FIG. 7, pixels of the electrode 250 may extend from opposite edges to provide coverage of the substrate surface 242. In use, each pixel of conductor 250 is capable, via an adjacent or connected electronic circuit or chip such as an amplifier as shown in FIG. 7, of detecting current spikes from the a-Si:H detecting layer 240 due to single alpha particles produced by single neutron absorption events in the neutron conversion layer 230.

To increase or maintain the sensitivity of the detector 200, it is useful to keep the pixels of electrode 250 small (in thickness and surface area) to reduce the electrical capacitance of the system and render the current spikes from a single alpha particle detectable (e.g., with TFT or other amplifiers either on the detector 200 or external to it). To this end, the surface area of each pixel may be maintained below about 10 $cm^2$, and, in one embodiment, the surface area is maintained less than about 0.5 $cm^2$ to match the capacitance of each pixel to operating parameters of a particular preamplifier that may be connected to a pixel of the top contact or electrode 250. It is also useful in some cases to cover as large a fraction as possible of the surface without exceeding the capacitance limit on each pixel. Hence, the gaps between pixels may be kept relatively small compared with their width. The width, $W_{electrode}$, of the pixels of the electrode 250 may be selected to achieve a particular surface area based on the pixel length, $L_{electrode}$ (e.g., length chosen to nearly match detector width, $W_{detector}$, or to extend across a fraction of the detector such as across half of the detector as shown in FIG. 7). It may also be desirable to keep the resistances of both the bottom electrode 220 and the top electrode 250 relatively low in order to reduce the time constant. The metal electrode layer or layers that lie between the neutron conversion layer and the PIN or NIP diode detector layer (e.g., an electrode adjacent to the conversion layer 420 such as electrode 430 in the detector 400 shown in FIG. 4) should typically be thin enough (e.g., thinner than about 100 nanometers) in order to pass the alpha particles generated in the neutron conversion layer without significant loss of their energy to the detecting layer. Additionally, for the abovementioned metal contact layer to effectively pass the alpha particles, the electrode(s) may be microstructured to be able to perform this function (e.g., one or both of the electrodes of a detector 200, 400, and so on may include micron-size, 10 micron-size, 100 micron-size, or the like size holes).

Figure 4:
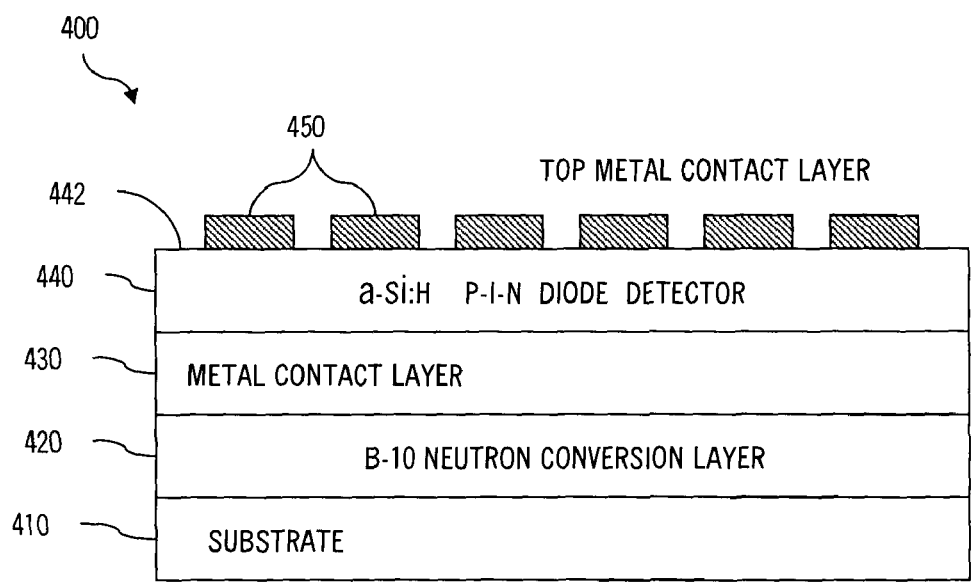
FIG. 4 is a sectional view similar to that of FIG. 2 showing another embodiment of a thin film neutron detector.

FIG. 4 illustrates a thin film neutron detector 400 similar to that of FIGS. 2 and 3 with the neutron conversion layer 420 deposited directly upon the substrate 410. The a-Si:H PIN diode detector 440 along with bottom contact layer 430 and top metal contact 450 (which is provided on surface 442) may be attached to the conversion layer 420 (or built up on the substrate 410 and conversion layer 420 by thin film deposition processes). In this manner, the conversion layer 420 and a-Si:H PIN diode structure 440 may be fabricated in separate steps and assembled at a later time to form detector 400. The metal contact layer 430 may abut the conversion layer 420, and the contact layer 430 may be made sufficiently thin or microstructured to facilitate passage of alpha particles from conversion layer 420 to detecting layer 440, or the conversion layer 420 may be on the top of top electrode 450, abut with the latter or even be separated by an air gap. In one example, the substrate 410 may be a plastic foil and the neutron conversion layer 420 may be sprayed or inkjet printed upon the substrate 420 via ink containing nanoparticles or the like providing the B-10 while the PIN diode structure 440 may be formed with known process for use with amorphous silicon formation.

It is believed that large arrays of amorphous silicon PIN diodes can be fabricated inexpensively, which will facilitate fabrication of detectors 400 which may be combined to form large area detectors (e.g., plurality of small detectors 400 may be arranged side-by-side to cover a larger area such as square meters in size). The per unit area cost will likely be as little as ten percent of the cost of Helium-3 tube neutron detectors. The semiconductor neutron detector 400 can be fabricated to be very thin, e.g., less than about 1 millimeter, while being as efficient as Helium-3 tube neutron detectors and other detectors. Additionally, it is believed that the detectors 400 will require little power to operate and will not require high voltage. Thin neutron detection devices including the detectors 200 and/or 400 may be deployed in many settings where large and bulky Helium-3 tube neutron detectors would be impractical.

In one embodiment, manufacture of the detector 400 includes depositing the B-10 conversion layer 420 upon a glass substrate 410, and then applying the metal contact layer 430 using chromium deposition by e-beam or thermal evaporation. The a-Si:H PIN or NIP diode structure 440 is provided using plasma enhanced chemical vapor deposition or other means of depositing high-quality hydrogenated amorphous silicon or related materials such as hot-wire chemical vapor deposition or reactive sputtering such as by applying the n-layer (e.g., 30 nanometers ($PH_3$ doped a-Si:H), the i-layer (e.g., 2.4 micrometers intrinsic a-Si:H), applying a graded buffer layer (e.g., approximately 50 angstroms thick), and applying the p-layer (e.g., 10 nanometers of B-doped a-$SiC_x$:H). The pixilated top contact 450 is then provided via mask.

The thin layers of boron-10, lithium-6, or the like utilized to form the neutron detectors described herein (e.g., 2 micron thick layers of materials containing boron-10, lithium-6, or other isotopes) may have relatively low neutron conversion efficiencies. For example, a 2-micron thick neutron conversion layer may only stop about 3 percent or less of the thermal neutrons that strike a detector. The thickness, though, typically is limited in an attempt to ensure that alpha particles created in collisions are successfully emitted from the neutron conversion layer for detection within an a-Si:H detecting layer, and alpha particles are relatively easily shielded (e.g., may be stopped by a few microns of material in the neutron conversion layer). Hence, it may not be useful to simply thicken the neutron conversion layer. Instead, embodiments of detectors may include additional neutron conversion layers, such as by providing neutron conversion layers and detecting/contact layers on both sides of a substrate. In this manner, the efficiency of the detection device may be doubled to 5 to 6 percent or the like.

Figure 5:
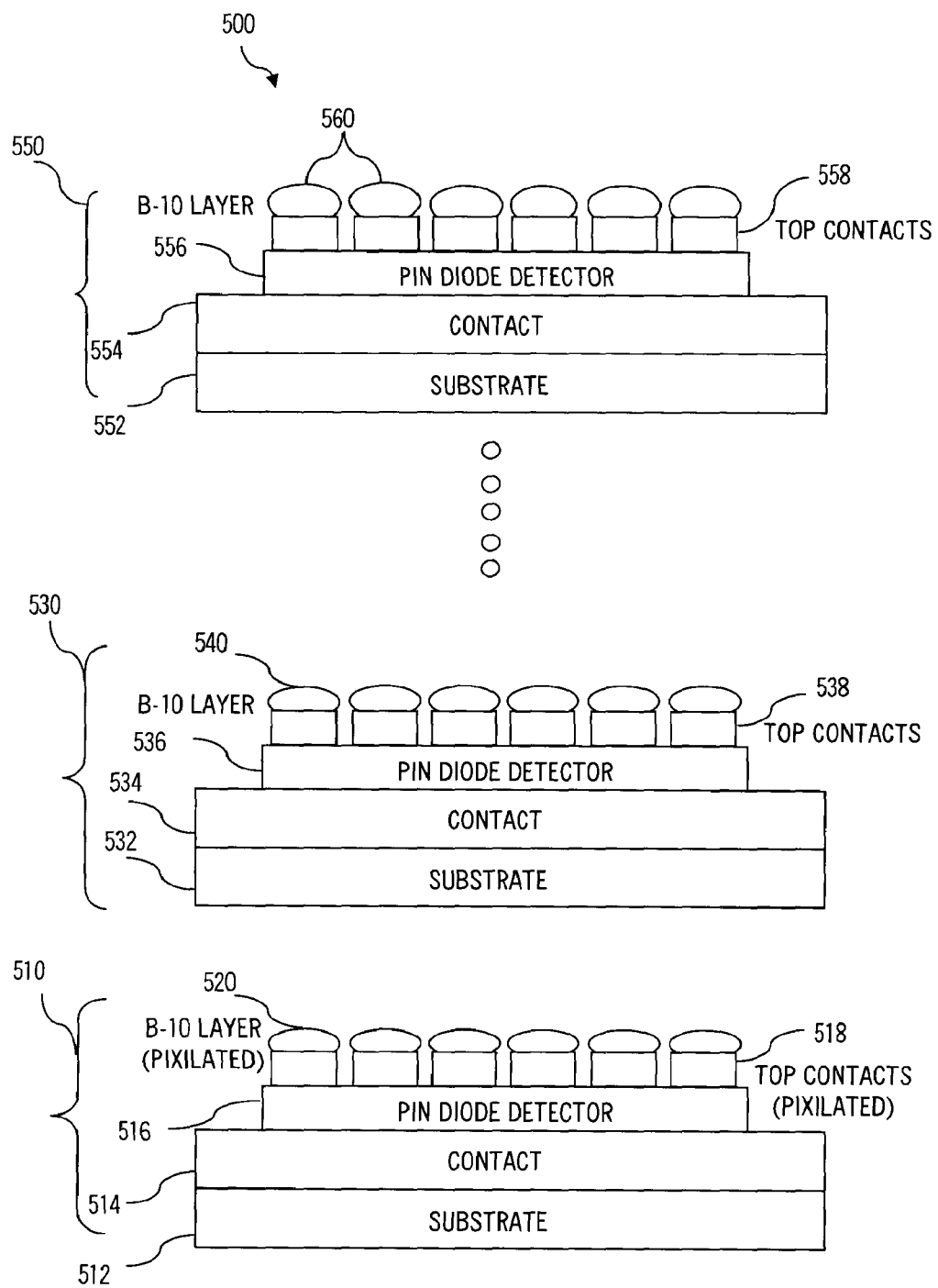
FIG. 5 is a sectional or end view similar to those of FIGS. 2 and 4 illustrating a neutron detection device that includes a number or plurality of thin film neutron detectors or sheets/layers in a stacked arrangement to enhance neutron detection efficiency (e.g., better detecting neutrons that pass through multiple detectors or layers rather than through a single neutron conversion layer)

For applications demanding an efficiency greater that about 6 percent, it may be useful to stack or layer 3 to 10 or more individual neutron detectors or sheets/layers. For example, there are some applications where detection needs to be relatively quick because the monitored object (e.g., a shipping container, luggage, or the like) is moving past the detector and/or the background noise and/or likely attempts at shielding require high sensitivity. FIG. 5 illustrates a neutron detection device 500 that may include three or more neutron detectors 510, 530, 550. In one example, the device 500 includes ten detectors 510, 530, 550 such that the efficiency ranges between about 25 and 30 percent. The detectors or detector sheets 510, 530, 550 are stacked into a multilayer structure or device 500 for high sensitivity, and the device 500 may be fabricated by mechanically assembling individual detectors or by repeated deposition of thin film device layers using patterning techniques such as masking, photolithography, or the like. Pixel connections extending to the side of the substrate allow for easy stacking of elements and electrical connection, e.g., into a socket to the circuitry (not shown) that processes the electronic pulse readout from each pixel or portions of pixilated contact/electrode.

In the device 500, the three neutron detectors 510, 530, 550 are configured with matching or identical arrangement of thin film layers, but, in other embodiments, the detectors 510, 530, 550 may differ from each other (e.g., take any of the forms described herein). As shown, each neutron detector or detector sheet 510, 530, 550 includes a substrate 512, 532, 552, a metal contact layer 514, 534, 554, and a PIN diode detector (e.g., an amorphous silicon thin film fabricated to provide electron-hole pairs to detect alpha particles) 516, 536, 556. In this embodiment, a set of elongated top contacts or pixels 518, 538, 558 are provided upon the PIN diode detectors 516, 536, 556, and the B-10 layer, lithium-6 layer, or neutron conversion layer 520, 540, 560 is provided on the contacts or pixels 518, 538, 558 (e.g., the neutron conversion material is pixilated or formed of elongated bodies or thin strips with dimensions similar to that of the supporting pixilated contacts). Thermal neutrons striking the upper detector 550 will either collide with a boron-10 isotope generating alpha particles (about 3 percent of the neutrons) or be passed to a next or lower neutron detector (with this process repeated throughout the neutron detection device 500). As with the other detector embodiments, the capacitances of each of the contact pixels of contacts 518, 538, 558 may be matched to a connected amplifier or pulse detection device, such as by limiting the surface area of each pixel to less than about 1 cm$^2$ and in some cases the surface area is about 0.5 cm$^2$ for each contact pixel (on one prototype, for example, each pixel had a length of about 24 millimeters and a width of about 3 millimeters).

Figure 6:
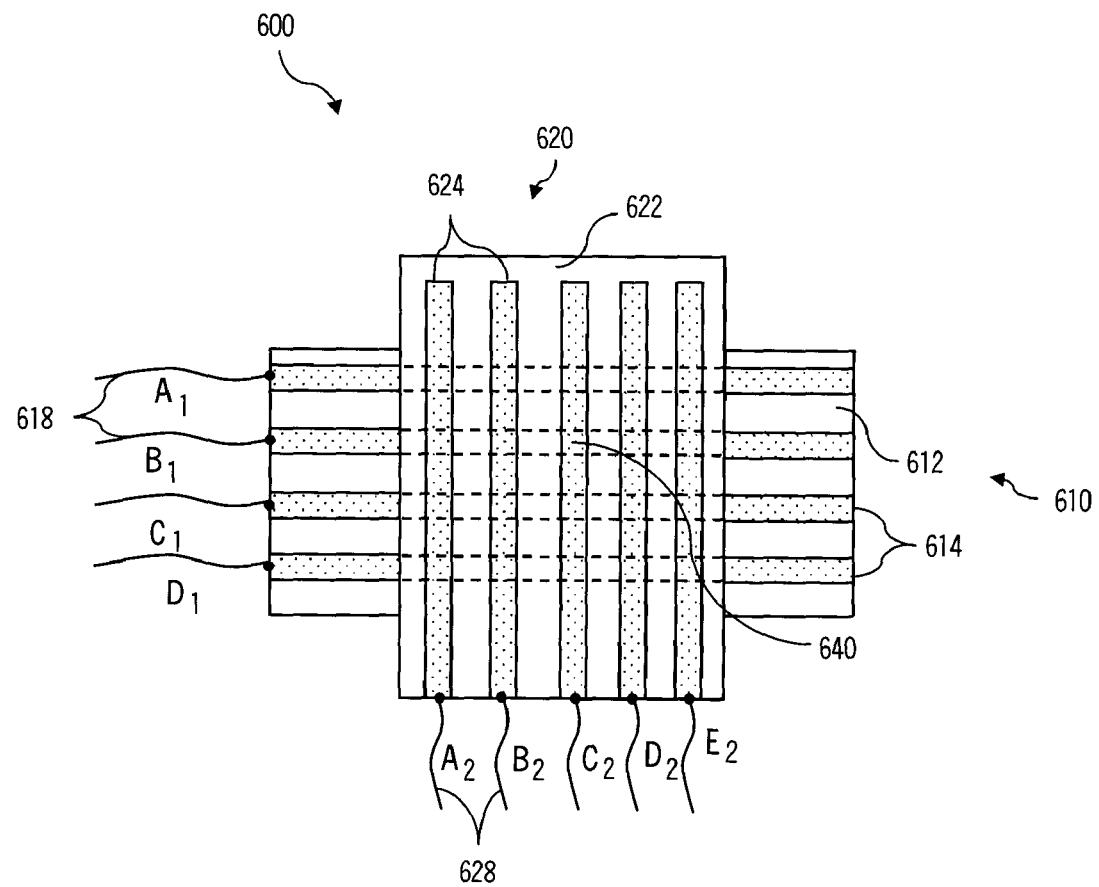
FIG. 6 is a top view similar to that of FIG. 3 showing a neutron detection device that includes two or more stacked neutron detectors or layers rotated such that the elongated, pixilated top electrodes are arranged at angular offsets (e.g., are not parallel to each other and, in some embodiments, with their longitudinal axes being orthogonal to each other)

The use of long and thin strips for the top contacts (e.g., a pixilated contact layer) allows the contacts to extend to the detector edge making wiring extremely easy (e.g., fitting into a socket of a ribbon cable or the like). Additional functionality may also be provided in a neutron detector using this contacting scheme. For example, FIG. 6 illustrates a two-layered neutron detection device 600 that not only provides enhanced efficiency (e.g., twice the efficiency of a one-layer structure) but also provides (or facilitates) imaging or location determination (e.g., locations of where neutrons are striking the neutron conversion layer). As shown, the device 600 includes a first detector 610 and a second detector 620 positioned over or stacked upon the first detector 610. The detectors 610, 620 may take the form of any of the detectors shown herein. The first detector 610 includes an upper substrate (e.g., an a-Si:H PIN or NIP diode structure or neutron conversion layer) 612 upon which a plurality of contact pixels or a pixilated contact 614 is provided. The elongated pixels 614 are shown to extend from a first edge where they are connected to leads 618. The second detector 620 likewise includes an upper substrate 622 and pixels 624 extend from an edge where they are connected to leads 628, and the leads 618, 628 would be connected to amplifiers or other devices for detecting current spikes associated with neutron conversion into alpha particles by the detectors 610, 620.

As shown, the detectors 610, 620 are stacked together such that they are rotated at angular offset such that the pixels 614, 624 are not parallel. More particularly, the pixels 614, 624 are orthogonal to each other (e.g., top detector 620 is rotated about 90 degrees relative to the detector 610). In an operating example, area 640 may be associated with a higher neutron flux. Neutrons penetrate the layers of the detectors 610, 620 within area 640 and produce alpha particles in the respective boron-10 or conversion layers adjacent amorphous silicon detecting layers. This causes signals to be detected on the pixels associated with leads $B_1$ (first layer 610) and $C_2$ (second layer 620). By processing the signals (with hardware and/or software associated with amplifiers or similar devices connected to leads 618, 628 but not shown in this example), the signal intensities in each pixel can be determined and the image may be constructed (e.g., by generating a matrix for detected signals in each pixel and/or each intersection of two pixels in adjacent layers 610, 620).

In this example, such imaging would indicate the area 640 of the detection device 600 is a location receiving a relatively high neutron flux and such location on a detection device 600 may be used to identify a location of a neutron source (e.g., a volume of plutonium or other radioactive material) such as within a container of material or objects. The stacked detectors 610, 620 or a similar configuration may also be used in medical neutron imaging with B-10, lithium-6, or other isotopes utilized to act to block or as a block for neutrons. A neutron source would e targeted at parts of the patient's body to image the locations of 10-B, lithium-6, or other neutron-blocking isotopes in, on, or near the patient's body.

FIG. 7 illustrates a representative neutron detection device 700, with a housing removed or not shown. The device 700 includes a board 710 upon which a neutron detector 720 is provided. The neutron detector 720 is shown to include a substrate 722 (such as a thin-film hydrogenated silicon p-i-n or n-i-p diode detector) and a plurality of top contacts 724 or a pixilated contact layer is deposited upon the substrate 722. The contact layer differs in that each pixel or contact portion 724 only extends about half way across the width of the substrate 722 but pairs of pixels 724 extend across the substrate 722 with ends connected via leads 726 to adjacent or nearby contacts or lead pads 728 on board 710. The contact pads 728 are then electrically connected to corresponding pulse/spike detection amps or circuits 730 (e.g., low-noise, FET preamp used to condition PIN or NIP diode output or the like), which function to detect spikes in current in the silicon-based detecting layer of the detector 720.

While not limiting, one implementation of the device 700 had a detector 720 with an overall size of about 2.54 cm by about 3.81 cm (e.g., 1-inch by 1.5 inches). The detector 720 had 22 rectangular contact pixels, with 20 being active and 2 being used to contact the bottom electrode. The pixel size was 2.8 mm by 11.5 mm, resulting in each pixel having a pixel surface area of about 0.32 cm$^2$ (or less than about 0.5 cm$^2$). The detector 720 had the following thin-film layers on top of a glass substrate: a neutron conversion layer including boron-10 carbide at about 1 to 1.5 micron thickness deposited, for example, by sputtering; a bottom metal contact layer formed of chromium; a thin-film amorphous hydrogenated silicon p-i-n diode detector with a total thickness of about 2.4 microns; and a pixilated top contact layer formed of palladium. The bottom metal contact may be made thin enough (e.g., 50 to 100 nanometers thick) to allow alpha particles generated in the neutron conversion layer to pass through the bottom metal contact and enter the p-i-n or n-i-p silicon detector layer without losing a significant fraction of their energy.

This implementation was successfully tested for neutron detection as follows. A $^{252}$Cf source with 1-inch high-density polyethylene was sued as the source of slow neutrons. Each of 20 detector pixels 724 was connected to a low noise field-effect-transistor (FET) preamplifier used to condition PIN diode output. The neutron irradiation test results showed that the pixels 724 of neutron detection device 700 were approximately 2.5 percent efficient in detecting the incident neutrons. Sensitivity of the thin-film neutron detector pixels 724 was simultaneously compared to a $^3$He neutron tube with known sensitivity. The PIN diodes were also subjected to a strong gamma flux, and no gamma response could be measured over several hours time. This demonstrates that the implementation is capable of detecting neutrons at efficiencies between 2 and 3 percent, with excellent discrimination between incident neutrons and gamma particles.

Sputtering and similar methods may be used to deposit the neutron conversion layer in the neutron detectors. However, in some cases, sputtering may lead to cracking and peeling problems as well as sometimes resulting in poor adhesion and uneven deposition of boron (e.g., when boron, boron carbide, or boron nitride is sputtered upon a substrate or onto an a-Si:H PIN or NIP diode structure). In some embodiments, it may be useful to deposit the neutron conversion layer/material in another way such as when the neutron conversion layer (or B-10 material, lithium-6, or the like) is deposited over the pixilated top contact. In such embodiments, it is important for the top coating with the B-10 isotopes to only cover the electrode or contact pixels and leave gaps in between adjacent pairs of such contact pixels. Otherwise, the top contacts may contact each other, and high fill factors for the pixels can be achieved by using inkjet printing (e.g., an ink or organic binder that includes nanoparticles of the boron-10 enriched material such as $^{10}$B$_4$C, boron enriched with boron-10, or $^{10}$B$_3$N$_3$), photoresist/liftoff processes, and the like. In some cases, the contacts may be made of micro- or nano-particles in an organic binder so that the coating of the boron-10 containing neutron conversion layer is insulating and does not bring the top contacts into electrical contact with each other. If the contacts are connected, a high reverse current through the diode would result and the background noise associated with this high reverse current would render the neutron-to-alpha current spike more difficult or even impossible to detect.

For example, FIGS. 8A-8D show an alternative to inkjet printing of the boron-10 onto the substrate or onto pixilated contact. The process shown uses a combination of photolithography and spin-coating of B-10 ink as one useful process for forming a thin-film neutron detector that controls/limits cracking/peeling of the neutron conversion layer. FIG. 8A shows a neutron detector 800 after initial stages of fabrication have been performed including deposition of a bottom contact (not shown) and a thin-film PIN diode structure (e.g., a detecting layer) 820 have been deposited or formed upon a substrate (e.g., a sheet/layer/foil of glass, plastic, metal, ceramic, or the like) 810. In FIG. 8A, a pixilated top contact 830 is deposited or formed on the upper or exposed surface of the detecting layer 820. Next, in FIG. 8B, photoresist 840 is applied to fill the gaps between the adjacent metal contacts 830. In FIG. 8C, the detector 800 is further fabricated by spin-coating with B-10 ink, and the ink is cured (e.g., to remove solvents or the like and leave $^{10}$B$_4$C (or other boron-10 material) and one or more organic binders).

FIG. 8D shows the neutron detector 800 after liftoff of the photoresist 830 as well as a portion of the B-10 material. As shown in FIG. 8D, the detector 800 includes a B-10 neutron conversion layer 860 that is only applied to the surfaces of the top contacts 830, and, as a result, the neutron conversion layer 860 is pixilated in a manner that matches the contact layer 830 (e.g., a plurality of long, thin bodies/pixels or elongated strips of B-10 material with small gaps between parallel pixels). In some cases, the top contact metals and the B-10 layer may be inkjet printed so that there is no removal step to reach 860. Alternatively, the B-10 layer may be everywhere (as in 850) if it is sufficiently insulating that it does not short the contacts 830.

FIG. 9 illustrates another embodiment of a neutron detection device 900 that may be manufactured by separately fabricating a detecting assembly 904 and a conversion assembly 908 and then laminating or otherwise combining the two assemblies 904 and 908 with the conversion film 950 in abutting contact (such as when an insulating B-10 conversion film is used) or with an air gap provided between the two assemblies 904 and 908. In the case of abutting contact, the neutron conversion layer may be printed or otherwise deposited in a pattern that matches the PIN electrode pattern, with gaps in between, or is insulating enough to prevent contacting between the individual pixel electrodes of the PIN detecting layer. The detecting assembly 904 includes a substrate 910 such as a thin layer or sheet of glass, metal, ceramic, or plastic (with plastic foil shown in FIG. 9). A bottom metal contact or electrode 920 is deposited upon the substrate 910 and then an a-Si:H detector layer (such as a PIN diode structure) 930 is formed upon the contact 920 (such as using the vacuum deposition or other thin-film processes discussed above). Next, a pixilated top electrode 940 is formed upon the detecting layer 930, such as a plurality of elongated or thin rectangular palladium pixels with relatively small capacitance (e.g., by maintaining the thickness and surface area relatively small such as a surface area of less than about 0.5 cm$^2$).

The conversion assembly 908 may be formed by spraying, spin-coating, inkjet or other printing, or other deposition techniques (including sputtering and other thin-film processes). In one case, a substrate 960 such as a flexible plastic foil is provided and a volume of ink including B-10 particles and organic binders are sprayed or printed upon the foil 960. The ink is then cured to produce the B-10 neutron conversion film 950, which may be a large percentage of B-10 nano- or microparticles and a small percentage of organic binder. The conversion film 950 typically is relatively thin with a thickness of less than about 5 microns and more typically less than about 2 microns (with some prototypes using thickness of about 1 to 1.5 microns with the particles being $^{10}$B$_4$C or the like). The conversion assembly 908 may then be laminated or otherwise layered on or near the detecting assembly 904 as shown with arrows 970. In other embodiments, a second conversion assembly 908 is applied by lamination or other assembly techniques to the other or opposite side of the substrate 910 to increase the sensitivity of the detection device 900. In still other embodiments, a plurality of the conversion and detecting assembly pairs 904, 908 are combined in a stacked arrangement to achieve a desired sensitivity of detection device 900 (such as 10 to 30 percent or more).

With the above description in mind, it will be understood that the neutron detectors taught provide an all-thin-film device that addresses prior problems associated with crystalline-based solid-state devices. The thin-film neutron detectors and neutron detection devices fabricated with such detectors may be produced at a fraction of the cost of existing neutron detectors and prototyped crystalline devices. Additionally, the detectors may be combined in a 2D pattern to produce a neutron detection device with a larger surface area (e.g., up to square meters in area). The detectors or devices may be provided on flexible substrates, and they also may be fabricated to provide a relatively lightweight finished product.

The above description also presents several unique ways of producing the B-10 neutron conversion layer (e.g., the B-10 carbide, B-10 nitride, boron, or similar thin film) such as by using sputtering or other thin film processes and based on use of nanoparticle inks. The neutron conversion layer may be manufactured, as discussed above with reference to FIGS. 8A-9, with B-10-containing ink. Such ink of B-10 (or B-10 compounds such as nitride or carbide) can be based, for example, on nano- or microparticles of these compounds. The ink can be spin coated in conjunction with photoresist masking and liftoff. In other cases, though, the ink may be inkjet printed onto a substrate or other layer of the detector in a desired pattern. This latter technique may be especially useful for producing the neutron conversion layer on top of the top electrode pattern (e.g., on top of a plurality of elongated contact pixels) with the gaps or spaces between the contact or electrode pixels not being filled with neutron conversion materials. In other cases, the sprayed or spin-coated conversion layer can be sufficiently insulating so that the multiplicity of detector pixels remain electrically isolated from one another.

In addition it may be useful to stress several other useful aspects or features of the described neutron detectors and neutron detection devices formed with such detectors. In some embodiments, it is beneficial to provide two B-10 containing layers in a detector. For example, a B-10 containing layer may be provided on both the bottom and top of the thin-film diode detector (e.g., a-Si:H-based detecting layer) that acts to detect alpha particles produced by neutrons received by or striking the B-10 particles in the two layers sandwiching the detecting layer. The two B-10 containing layers (bottom and top or first and second, spaced apart layers) may be produced by the same or differing deposition methods and may have similar or differing compositions and physical configurations (e.g., one may be sputtered onto a substrate or contact layer and be formed of a B-10 compound such as nitride or carbide while the other is applied using inkjet printing of an ink containing nanoparticles with B-10).

The thin-film detectors also lend themselves to being stacked in one of several ways to increase overall sensitivity of the finished device (e.g., the devices shown in FIGS. 5 and 6 and so on). One way to provide a stacked detection device is to deposit second (and consequently, the third, fourth, and so on) detector directly on top of the previous detector using thin film deposition processes with appropriate masking techniques. Here, the B-10 containing layers serve as neutron conversion layers for PIN diode or other detecting layers on both sides of these B-10 neutron conversion layers (e.g., top and bottom conversion layers sandwich a-Si:H detecting layers and the conversion layers emit alpha particles in all directions and not just the direction of the path of the received or striking neutron). In this manner, it is not just deposition of many individual detectors on top of each other, but the depositing or fabrication of an integrated, multilayer detection device that contains several neutron conversion layers and several detecting layers (e.g., PIN diode alpha detectors).

Another method of forming a stacked arrangement involves depositing individual detectors (e.g., diode with neutron conversion layer(s)) on thin (and, optionally, flexible) substrate sheets, with a detector provided upon one or both sides of the substrate sheet. Then, fabrication of the device involves laminating or otherwise assembling two or more of the substrate sheets together into one, still relatively thin (and, optionally, flexible) multilayer detection sheet or device. In this design, additional neutron conversion layers can also be deposited separately on similar substrate sheets and laminated together with diode detectors on different sheets, as an alternative to direct deposition of the top neutron conversion layers.

The invention claimed is:

1. A method of fabricating a neutron detection device, comprising:
providing an alpha particle detecting layer comprising an amorphous silicon diode thin-film structure;
forming a top metal contact upon the diode thin-film structure comprising a plurality of elongated pixels; and
providing a layer of boron-10 containing material proximate to the diode thin-film structure;
wherein the providing of the boron-10 containing material comprises depositing an ink comprising particles of boron-10 containing material or boron-10 containing molecules.

2. The method of claim 1, wherein the ink is applied by depositing a layer on top of or below the alpha particle detecting layer using a deposition process selected from the group consisting of spin-coating, spraying, and inkjet printing.

3. The method of claim 1, wherein the ink is applied to the pixels of the top metal contact.

4. The method of claim 3, wherein the neutron conversion layer comprises an additive selected such that the neutron conversion layer is electrically insulating.

5. The method of claim 1, wherein the ink is applied to a substrate, and the providing of the layer of boron-10 containing material further includes attaching the substrate to a substrate supporting the diode thin-film structure.

6. The method of claim 1, wherein the particles comprise nanoparticles of elemental boron, B-10 boron carbide, or B-10 boron nitride.

7. The method of claim 1, wherein the providing of the diode thin-film structure comprises thin-film deposition of hydrogenated amorphous silicon upon a flexible substrate.

8. The method of claim 1, further comprising, at least once, repeating the providing of the diode thin-film structure, the forming of the top metal contact, and the providing of the layer of boron-10 containing material to form a stack of neutron detectors comprising neutron converter material, thin film silicon material, and metal contacting materials.

9. The method of claim 1, further comprising forming a bottom metal contact proximate to the alpha particle detecting layer and generating holes in at least one of the bottom and top metal contacts to provide passages for alpha particles transmitted from the layer of boron-10, whereby fewer of the alpha particles are blocked.

* * * * *